United States Patent [19]

Kihara

[11] Patent Number: 4,805,153
[45] Date of Patent: Feb. 14, 1989

[54] INPUT BUFFER CIRCUIT OF A MOS MEMORY DEVICE

[75] Inventor: Yuji Kihara, Itami, Japan

[73] Assignee: Mitsubishi Denki Kabushiki Kaisha, Japan

[21] Appl. No.: 4,152

[22] Filed: Jan. 16, 1987

[30] Foreign Application Priority Data

Mar. 5, 1986 [JP] Japan .................................. 61-49443

[51] Int. Cl.$^4$ ................................................. G11C 8/00
[52] U.S. Cl. ..................................... 365/230; 307/279
[58] Field of Search ............... 365/189, 203, 230, 233, 365/190, 202; 307/279

[56] References Cited

U.S. PATENT DOCUMENTS 4,099,265 7/1978 Abe ..................................... 365/190
4,355,377 10/1982 Sud et al. ............................ 365/203

Primary Examiner—Joseph A. Popek
Attorney, Agent, or Firm—Saidman, Sterne, Kessler & Goldstein

[57] ABSTRACT

An input buffer circuit of a MOS memory device includes an input terminal for receiving an address signal, complementary output terminals, and an inverter circuit which propagates the address signal from the input terminal to the complementary output terminals, to provide the complementary output terminals with an address signal and an inverted address signal. A transition of the address signal is detected as it is propagated through the inverter circuit, and the potentials of the complementary output terminals are equalized before the transition is propagated to the complementary output terminals.

25 Claims, 5 Drawing Sheets

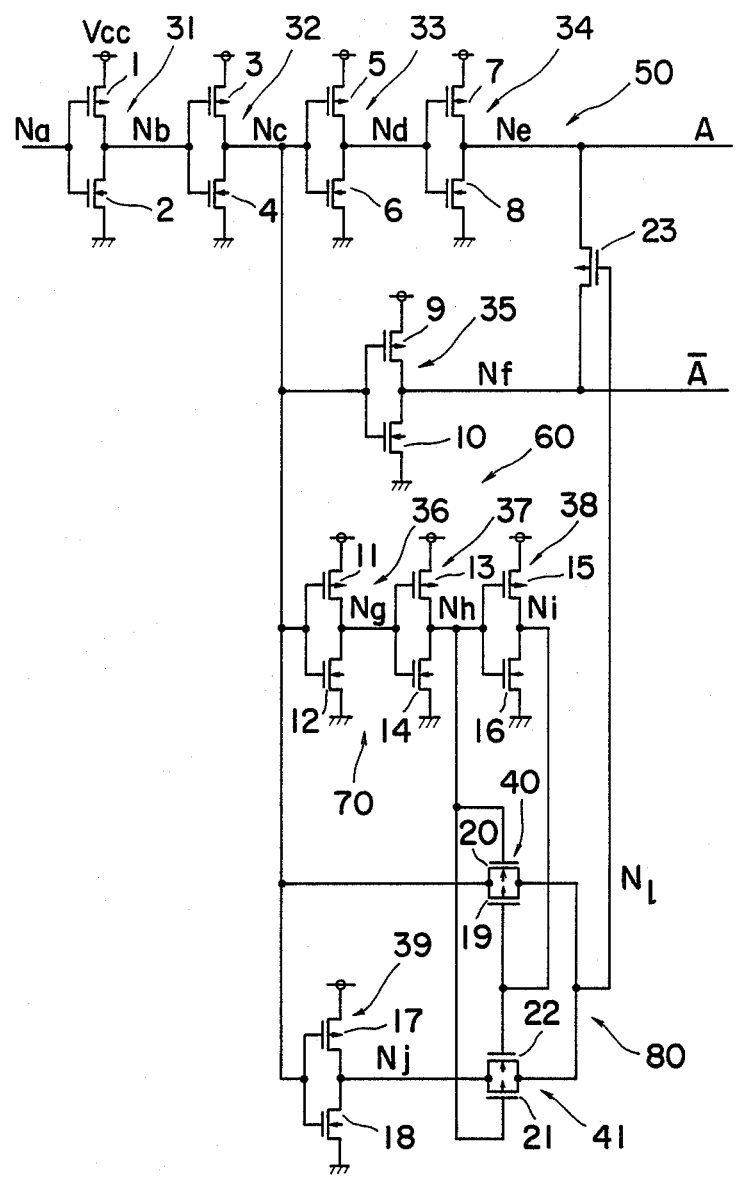
F I G. 2

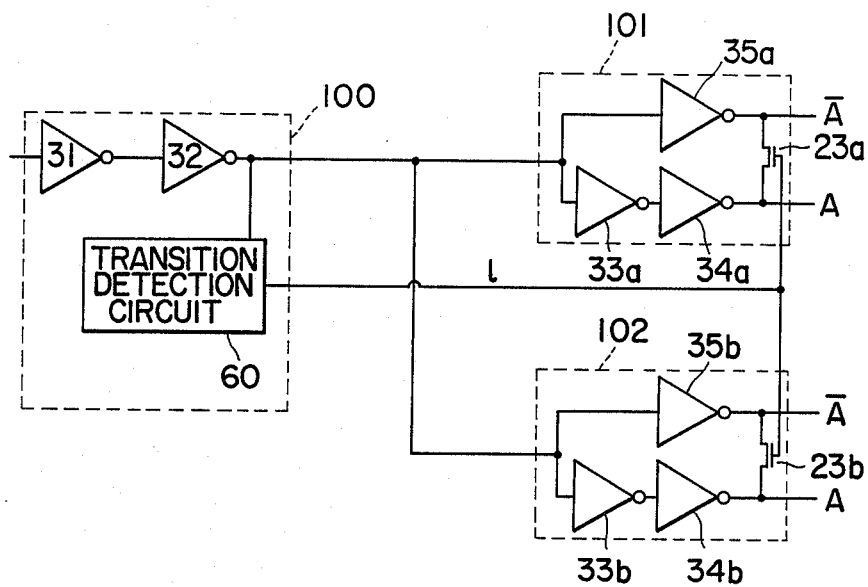
F I G. 5

INPUT BUFFER CIRCUIT OF A MOS MEMORY DEVICE

BACKGROUND OF THE INVENTION

The present invention relates to an input buffer circuit of a MOS memory circuit, particularly a high speed static RAM, and more particularly to an improvement for reducing the delay of such an input buffer circuit.

FIG. 1 shows a conventional input buffer circuit of a CMOS (complementary metal oxide semiconductor) SRAM (static random access memory) which is directly connectable with a TTL (transistor transistor logic) circuit. As illustrated, the input buffer circuit comprises MOS inverters 31 through 35, comprising P-channel MOS transistors 1, 3, 5, 7, 9 and N-channel MOS transistors 2, 4, 6, 8, 10. In order to permit direct connection with a TTL circuit, the MOS transistors 1 and 2 of the first-stage inverter 31 must have such sizes W that the inverter 31 recognizes "H" when the input at the node Na is 2.2 V or higher and recognizes "L" when the input is 0.8 V or lower, where the power source voltage Vcc is at 5 V±10%. For this reason, the size W of the N-channel side is designed to be larger than in the ordinary CMOS inverters. As a result, the node Nb is more easily pulled low ("L") and is less easily pulled high ("H"). To compensate for this situation, the size W of the N-channel side of the inverter 32 is also set smaller than usual, so that a signal of a normal MOS level is produced at the node Nc.

The inverter 33 is provided merely to invert the signal. The reason for providing this inverter 33 is to enable production of an output signal A and an inverted output signal $\overline{A}$, which are supplied as an address signal and an inverted address signal to an address decoder.

The inverters 34 and 35 are the final stages of the input buffer circuit. The nodes Ne and Nf are connected to multiple decoders, so that they are parasitized with very large capacitances including the gate capacitances. The nodes Ne and Nf cannot be inverted quickly even if the sizes W of the transistors 7 through 10 are made relativily large. Moreover, if the sizes W of the transistors 7 through 10 are made large, the nodes Nc and Nd may be parasitized with large capacitances. This is a problem in a large capacity memory.

The conventional input buffer circuit having a construction described above occupies about 25% of the access delay in a high speed SRAM, and forms an obstacle to speed increase.

SUMMARY OF THE INVENTION

An object of the invention is to provide an input buffer circuit of a MOS memory device having a shorter propagation delay.

According to the invention, there is provided an input buffer circuit of a MOS memory device comprising an input terminal for receiving an address signal, complementary output terminals, inverter circuit means for propagating the address signal from the input terminal to the complementary output terminals and providing the complementary output terminals with an address signal and an inverted address signal, a transition detecting circuit for detecting a transition of the address signal as it is propagated through the inverter circuit means, and an equalizing circuit responsive to the detection of the transition for equalizing the potentials of the complementary output terminals before the transition is propagated to the complementary output terminals.

By virtue of the equalization upon the transition in the input address signal, the potentials on the output lines will be at a level intermediate between the "H" and "L" levels before the input signal change is propagated through the cascaded inverters, so that the subsequent change in the output lines to assume the levels corresponding to the new input signal level will take a shorter time than if the change must occur from the original (before the equalization) levels, as in the prior art. Accordingly, overall delay of the input buffer circuit is shortened.

BRIEF DESCRIPTION OF THE DRAWINGS

In the accompanying drawings:

FIG. 2 is a circuit diagham showing an input buffer circuit of an embodiment of the invention;

FIG. 5 is a block diagram showing an input buffer circuit of a further embodoiment of the invention.

DETAILED DESCRIPTION OF THE PREFERRED EMBODIMENTS

Figure 1:
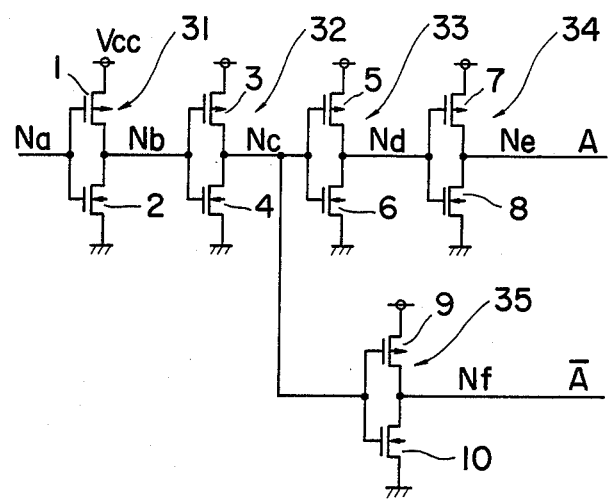
FIG. 1 is a circuit diagram showing a conventional input buffer circuit.

As shown in FIG. 2, an input buffer circuit according to the invention comprises inverters 31 through 35 comprising P-channel MOS transistors 1, 3, 5, 7, 9 and N-channel MOS transistors 2, 4, 6, 8, 10. An input terminal or node Na is connected to receive an input address from a TTL circuit. The inverters 31 through 35 are connected in a manner similar to that described with reference to FIG. 1.

According to the invention there is further provided an input address signal transition detecting circuit 60, which detects transition in the input address signal and produces, at the node N1, a pulse upon the detection of the transition.

The transition detecting circuit 60 of this embodiment comprises a delay circuit 70 comprising inverters 36 and 37 comprising P-channel MOS transistors 11, 13 and N-channel MOS transistors 12, 14. The transition detection circuit 60 also comprises an Exclusive-OR circuit 80 formed of MOS transistors 15 through 22.

In addition, a P-channel MOS transistor 23 is provided to be turned on by a negative pulse at the node N1 to equalize the potentials on the nodes Ne and Nf becomes about ($\frac{1}{2}$) Vcc, i.e., midway between the levels which the nodes Ne and Nf have had before the equalization.

The timing of the pulse generation is so determined that, at about the end of the pulse, the transition in the input address signal is propagated through the inverters 31 through 35 to the nodes Ne and Nf. When the transition in the input address signal is propagated through the inverters 31 through 35 to the nodes Ne and Nf, by which time the equalizing transistor 23 has been turned off, there occur a transition from Vcc/2 to Vcc or 0 on the node Ne and a transition from Vcc/2 to 0 or Vcc on the node Nf. Thus, the transitions on the nodes Ne and Nf are from the midway potential Vcc/2. The transitions will therefore take shorter time than if they must go all the way from 0 to Vcc or Vcc to 0.

Figure 3:
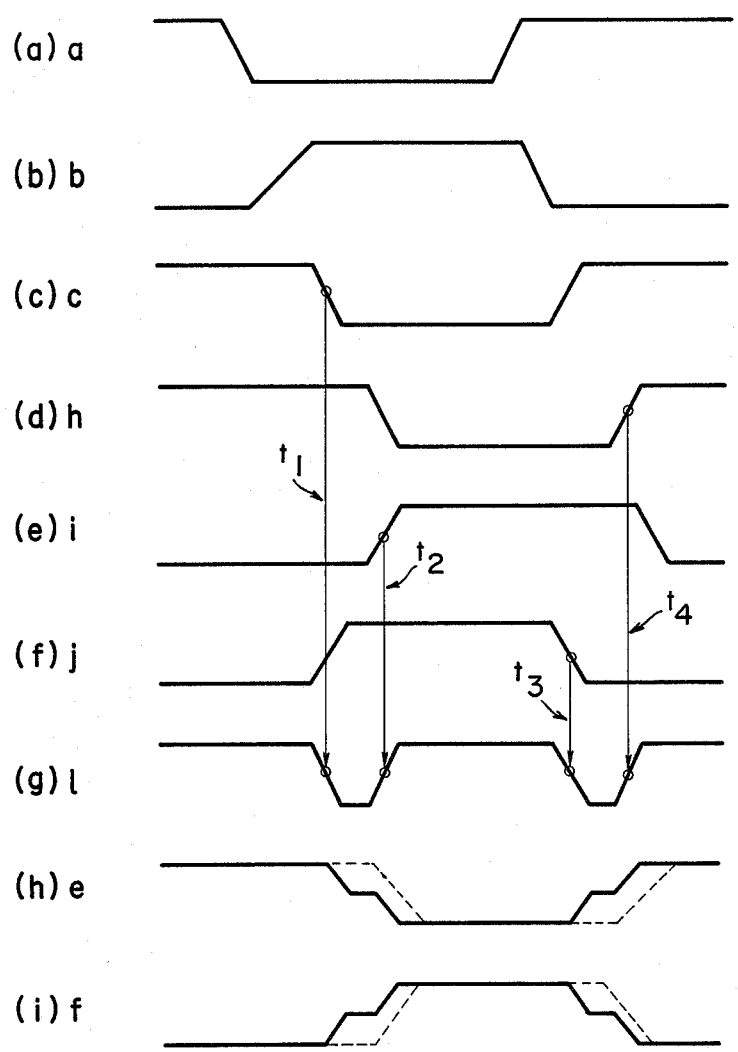
FIG. 3 is a time chart showing signals at various nodes in the circuit of FIG. 2.

The operation of the circuit is described in further detail with reference to FIG. 3, which illustrates, only schematically, the variations in potentials on the various nodes.

When the node Na falls from "H" to "L", the node Ne falls, after the delay of two stages (31, 32), from "H" to "L". The node Nh is at "H" and the node Ni is at "L" until the transition arrives. Until then, the transfer gate 40 is kept ON while the transfer gate 41 is kept OFF. The node Nl therefore follows the potential on the node Nc. That is, it falls from "H" to "L".

The node Nh falls, after the delay of two stages (36, 37), from "H" to "L", and the node Ni rises, after the further delay of one stage (38), from "L" to "H". Therefore, the transfer gate 41 is turned on and the transfer gate 40 is turned off. The node Nl therefore follows the potential of the node Nj, which is the output of an inverter 39. The node Nj rises from "L" to "H" before the node Nh falls from "H" to "L". Therefore, before the transfer gate 41 is turned on, the node Nj has been changed to "H". The node Nl will therefore rise from "L" to "H" when the transfer gate 41 conducts and the transfer gate 40 is turned off.

Thus, when the node Na falls from "H" to "L", the node Nl undergoes a change of "H" to "L" and then to "H". That is, a pulse, a negative pulse, is generated on the node Nl. The duration of the pulse is dependent on the delay of the inverters 36 and 37, as well as the smaller delay of inverter 38.

When the node Na rises from "L" to "H", the node Nc rises, after the delay of two stages (31, 32), from "L" to "H". The node Nh is at "L" and the node Ni is at "H" until the transition is propagated there. Until then, the transfer gate 41 is kept ON while the transfer gate 40 is kept off. The node Nl therefore follows the potential on the node Nj, which falls, after the delay of one stage 39. The node Nl therefore falls from "H" to "L" when the node Nj falls from "H" to "L".

When the node $N_c$ rises, the node $N_h$ rises, after the delay of two stages (36, 37), from "L" to "H" (at time $T_4$), and the node $N_i$ falls, after the further delay of one stage (38), from "H" to "L". Therefore, the transfer gate 40 is turned on and the transfer gate 41 is turned off. The node Nl will thereafter follows the potential on the node Nc. That is, it rises from "L" to "H".

Thus, when the node Na rises from "L" to "H", the node Nl undergoes a change from "H" to "L", and then to "H". That is, a negative pulse is again produced. The duration of the pulse is dependent on the delay of the inverters 36 and 37.

It is noted that the delay times of the inverters 38 and 39 are negligible compared with the delay time of the inverter 36 and 37.

In summary, a negative pulse is generated on the node Nl when there occurs a transition, may it be from "H" to "L" or "L" to "H", on the node Na. The duration of the pulse corresponds to the delay time of the inverters 36 and 37, as well as the smaller delay time of inverter 38. In either case, the end of the pulse is the time when the transition on the node Nc is propagated to the node Nh, i.e., it is fixed relative to the time when the transition on the node Na is expected to reach the nodes Ne and Nf. By having the end of the pulse come at about or immediately before the arrival of the transition at the node Ne and Nf, the change on the nodes Ne and Nf to assume the new levels corresponding to the new level on the node Na can start from the equalized potential, Vcc/2. The nodes Ne and Nf will reach the new levels as indicated by solid lines earlier than if the changes start at the original levels as indicated by broken lines. Thus, the overall time required for the transition to be propagated and completed is shortened. In other words, the propagation delay of the input buffer circuit is shortened and an obstacle to increase in the speed of the access of a memory has been eliminated.

Figure 4:
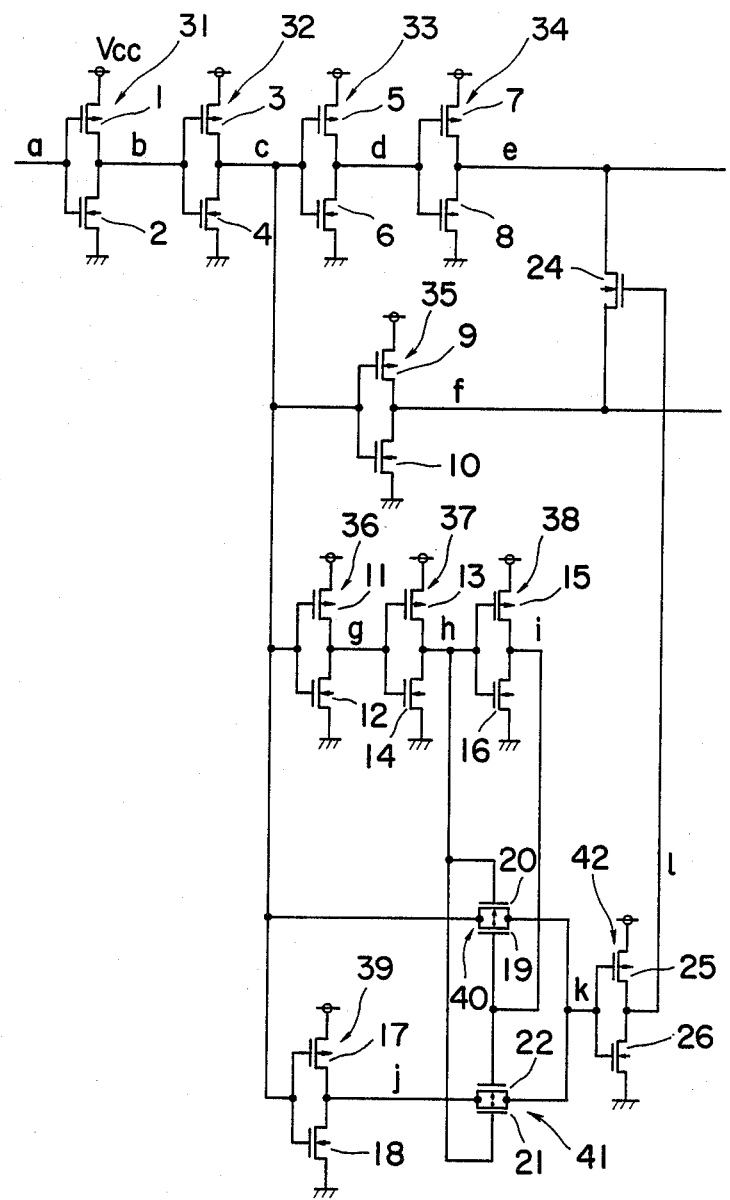
FIG. 4 is a circuit diagram showing an input buffer circuit of a second embodiment of the invention.

In the embodiment described, a P-channel MOS transistor 23 is used to couple the nodes Ne and Nf for equalization. Alternatively, an N-channel MOS transistor 24, as shown in FIG. 4 may be used. In this case, a positive pulse must be applied to the gate of the equalizing transistor 24. To provide the positive pulse, an additional inverter 42 may be used. Use of the additional inverter 42 may be advantageous where the node Nl has a large capacitance. This is explained below: The node Nl is driven by an inverter 32 or 39, through transistors 19 and 20, or 21 and 22. When the wiring capacitance of the node Nl is large, the pulse at the output side of the transistors 19 through 22 will have dull edges, and equalization may not be successfully achieved. The additional inverter 42 functions also as a waveform shaping circuit to provide a pulse with sharp edges. Thus, the equalizing operation is achieved without fail.

The wiring capacitance of the node Nl is particularly large where the node Nl is connected to a plurality of equalizing transistors, as shown in FIG. 5, in which the reference numerals 23a, 33a through 35a, and 23b, 33b through 35a are similar to the transistor 23 and the inverters 33 through 35 of FIG. 2 or FIG. 4. The wiring capacitance of the node Nl may also be large where the wiring of the node Nl is long. This is the case where the combination of the inverters 31 and 32 and the address signal transition detection circuit 60, and the combination of the transistor 23a and the inverters 33a through 35a and the combination of the transistor 23b and the inverters 33b through 35b are disposed at different location, as indicated by broken lines 100, 101 and 102.

What is claimed is:

1. An input buffer circuit of a MOS memory device, comprising
   an input terminal for receiving an address signal,
   complementary output terminals,
   inverter circuit means for propagating said address signal from said input terminal to said complementary output terminals and providing said complementary output terminals with an address signal and an inverted address signal,
   a transition detecting circuit for detecting a transition of said address signal as it is propagated through said inverter circuit means, and
   an equalizing circuit responsive to the detection of the transition for equalizing the potentials of said complementary output terminals before the transition is propagated to said complementary output terminals.

2. A circuit according to claim 1, wherein said equalizing circuit comprises an MOS transistor coupling said complementary output terminals together, and connected to be made conductive when equalization is to be effected.

3. A circuit according to claim 2, wherein said transition detecting circuit produces a pulse for turning on said MOS transistor when it detects the transition, the duration of said pulse being terminated before the transition is propagated through said inverter circuit to said complementary output terminal.

4. A circuit according to claim 1, wherein said inverter circuit means comprises:
first and second inverters cascaded to each other, and a third inverter, and
an output of said second inverter and an output of said third inverter forming said complementary output address terminals, and
an input of said first inverter and the input of said third inverter being connected to a common node to which said address signal is propagated from said input terminal of said input buffer circuit.

5. A circuit according to claim 4, further comprising fourth and fifth inverters cascaded to each other,
an input of said fourth inverter being connected to said input terminal of the input buffer circuit and
an output of said fifth inverting connected to said common node.

6. A circuit according to claim 5, wherein said fourth inverter is formed to be connectable with a TTL circuit.

7. A circuit according to claim 5, wherein said transition detecting circuit has its input connected to said common node.

8. A circuit according to claim 7,
wherein said transition detecting circuit comprises a transfer gate having its input connected to said common node,
and further comprising a MOS transistor connected to couple said complementary output terminals together and connected to be made conductive by a pulse produced at the output of said transfer gate, and
a delay circuit means producing a delayed signal delayed with respect to the signal at said common node and making nonconductive said transfer gate until it produces the delayed signal.

9. A circuit according to claim 8, wherein said MOS transistor is a P-channel MOS transistor and has a gate connected directly to said output of said transfer gate.

10. A circuit according to claim 8 wherein said MOS transistor is an N-channel MOS transistor, and said transition detecting circuit further comprises an additional inverter which receives the output of said transfer gate and accordingly applies an inverted output to the gate of said MOS transistor.

11. The input buffer circuit of claim 1, wherein said inverter circuit means comprises:
a first CMOS inverter stage connected directly to said input terminal to receive said address signal therefrom, and
a second CMOS inverter stage connected to said first CMOS inverter to receive an inverted signal, corresponding to said address signal, therefrom;
wherein the relative size of the N-channel side of said first inverter is larger than the relative size of the N-channel side of said second inverter.

12. The input buffer circuit of claim 1, wherein said transition detecting circuit comprises a delay circuit and an exclusive-OR circuit, and the output of said delay circuit provides one input into said exclusive-OR circuit.

13. The input buffer circuit of claim 1, wherein said transition detecting circuit is connected to control a plurality of said equalizing transistors, each said equalizing transistor being connected to selectably couple together a respective pair of said output terminals.

14. An input buffer circuit of an MOS integrated circuit, comprising:
an input terminal for receiving an address signal;
complementary output terminals;
inverter circuitry, comprising a plurality of CMOS inverters, connected to propagate said address signal from said input terminal to said complementary output terminals, and to provide true and complemented signals, corresponding to said address signal, at said respective output terminals;
a transition detecting circuit, connected
to detect transitions at an internal node of said inverter circuitry which is separated from each of said output terminals by at least one CMOS inverter stage, and
to provide a negative pulse whenever a transition is detected at said internal node;
an NMOS equalizing transistor, controlled by said transition detecting circuit to selectively couple said output terminals together;
wherein said negative pulses provided by said transition detecting circuit are connected to the gate of said equalizing transistor through at least one CMOS inverter stage.

15. The input buffer circuit of claim 14, wherein said transition detecting circuit comprises more than two inverter stages, and at least two of said inverter stages of said transition detecting circuit have propagation times much slower than the propagation times of others of said inverter stages.

16. The input buffer circuit of claim 14, wherein said inverter circuitry comprises:
a first CMOS inverter stage connected directly to said input terminal to receive said address signal therefrom, and
a second CMOS inverter stage connected to said first CMOS inverter to receive an inverted signal, corresponding to said address signal, therefrom;
wherein the relative size of the N-channel side of said first inverter is larger than the relative size of the N-channel side of said second inverter.

17. The input buffer circuit of claim 14, wherein said transition detecting circuit comprises a delay circuit and an exclusive-OR circuit, and the output of said delay circuit provides one input into said exclusive-OR circuit.

18. The input buffer circuit of claim 14, wherein said transition detecting circuit is connected to control a plurality of said equalizing transistors, each said equalizing transistor being connected to selectably couple together a respective pair of said output terminals.

19. An input buffer circuit of a memory device, comprising:
an input terminal for receiving an address signal;
complementary output terminals;
a plurality of inverter stages connected to propagate said address signal from said input terminal to said complementary output terminals, and to provide true and complemented signals, corresponding to said address signal, at said respective output terminals;
a transition detecting circuit; and
an equalizing transistor, controlled by said transition detecting circuit to selectively couple said output terminals together;
wherein said transition detecting circuit detects transitions of said address signal, and accordingly turns on said equalizing transistor, while said address signal is still propagating through said inverter stages.

20. The input buffer circuit of claim 19, wherein said transition detecting circuit comprises more than two inverter stages, and at least two of said inverter stages of said transition detecting circuit have propagation times much slower than the propagation times of others of said inverter stages.

21. The input buffer circuit of claim 19, wherein said transition detecting circuit comprises a delay circuit and an exclusive-OR circuit, and the output of said delay circuit provides one input into said exclusive-OR circuit.

22. An input address buffer circuit, comprising:
an input terminal for receiving an address signal;
complementary output terminals;
inverter circuitry connected to propagate said address signal from said input terminal to said complementary output terminals, and to provide true and complemented signals, corresponding to said address signal, at said respective output terminals;
a transition detecting circuit, connected to detect transitions at an internal node of said inverter circuitry, which is separated from each of said output terminals by at least one inverter stage;
an equalizing transistor, controlled by said transition detecting circuit to selectively couple said output terminals together;
wherein said transition detecting circuit turns on said equalizing transistor whenever a transition is detected at said internal node.

23. The input address buffer circuit of claim 22, wherein said transition detecting circuit is connected to control multiple ones of said equalizing transistors.

24. The input address buffer circuit of claim 22, wherein said transition detecting circuit comprises a delay circuit and an exclusive-OR circuit, and the output of said delay circuit provides one input into said exclusive-OR circuit.

25. The input address buffer circuit of claim 22, wherein said transition detecting circuit is connected to control a plurality of said equalizing transistors, each said equalizing transistor being connected to selectably couple together a respective pair of said output terminals.

* * * * *